United States Patent [19]
Cockrum et al.

[11] Patent Number: 5,179,283
[45] Date of Patent: Jan. 12, 1993

[54] INFRARED DETECTOR FOCAL PLANE

[75] Inventors: Charles A. Cockrum; Wallace Y. Kunimoto, both of Goleta, Calif.

[73] Assignee: Santa Barbara Research Center, Goleta, Calif.

[21] Appl. No.: 390,058

[22] Filed: Aug. 7, 1989

[51] Int. Cl.[5] .............................................. G01J 5/26
[52] U.S. Cl. .................................... 250/352; 250/349; 250/370.15
[58] Field of Search ................... 250/352, 349, 370.15

[56] References Cited
U.S. PATENT DOCUMENTS 4,755,676  7/1988  Gaalema et al. .................... 250/352
4,862,002  8/1989  Wang et al. ......................... 250/352

Primary Examiner—Mark Hellner
Attorney, Agent, or Firm—W. C. Schubert; W. K. Denson-Low

[57] ABSTRACT

An infrared detector assembly (12) of the type used in munitions and night vision systems having an improved focal plane platform (10) construction. In accordance with this invention, the thermally conductive focal plane platform (10) supports a detector array (26) and integrated readout chips (28). The focal plane platform (10) includes relatively thermally non-conductive inserts (38) disposed in cavities (36) positioned generally below each integrated read out chip (28). The inserts insulate the chips (28) during cryogenic cooling of detector array (26). Freeze-out of the chips (28) is thereby inhibited.

23 Claims, 4 Drawing Sheets

INFRARED DETECTOR FOCAL PLANE

BACKGROUND OF THE INVENTION

1. Field of the Invention

This invention relates to an improved infrared seeker assembly, and more particularly to one having an improved focal plane platform construction.

2. Discussion

Infrared detection systems are often used in conjunction with systems for sensing electromagnetic radiation in the wavelength range of one to fifteen micrometers. Because many such detection systems have photoconductive detector arrays which are most sensitive when operated at about 80° K., a cooling system is required to produce and maintain the required low operating temperatures. Typically, such cooling systems either take the form of a cryostat utilizing the Joule-Thompson effect, or a Stirling cycle cryoengine. The cooling systems are used in conjunction with an evacuated dewar in which the electromagnetic detector is placed. The dewar is evacuated to remove thermally conductive gases which would otherwise occupy the volume surrounding the detector so that potential heat load through convection and conduction is minimized. The evacuated dewar also prevents moisture from condensing on the detector. The detector is cooled by placing an indented region ("coldwell") of the dewar in contact with an expansion chamber ("expander") of the cryogenic cooling system. Commonly, the expander has a cylindrical tube ("coldfinger") having an end which is cooled and which supports a focal plane platform upon which the detector and related components, such as integrated circuit amplifier and readout chips, are mounted. Alternately, the dewar can be constructed without a coldfinger such that the detector is mechanically supported directly by the focal plane platform. The cooling system produces cyclical cooling by sequential compression of a working fluid such as helium, removal of the heat generated during compression of the working fluid, and subsequent expansion of the working fluid. Thermal energy is withdrawn from the detector through the focal plane platform which is in thermally conductive communication with the cooling system. Since the cooling system is in thermal communication with the focal plane platform, expansion of the working fluid within the coldwell causes thermal energy to be withdrawn from the detector.

In order to produce efficient conductive withdrawal of thermal energy from an electromagnetic detector, the focal plane platform on which the detector is mounted must be fabricated from a material, or composition of materials, possessing specific metallurgical properties. Ideally, these properties include high strength, a high modulus of elasticity and high thermal conductivity. Additionally, the focal plane platform must produce low thermal distortion characteristics to minimize premature detector failures.

A number of design constraints affect the design of the focal plane platform. Since the focal plane platform is a structural support member, it must have sufficient bending stiffness to minimize mechanical deflection of the electromagnetic detector and the amplifier chip. Such requirements become particularly significant when the infrared seeker assembly is subjected to intense vibration and high levels of boost-phase acceleration. Another significant design parameter is the extent to which heat is transferred through the focal plane platform.

As previously mentioned, typical photoconductive detector-arrays are most sensitive at an operating temperature of about 80° K. However, the bipolar silicon amplifier circuits, provided for electrically interfacing the detectors to remote multiplexer circuits do not operate effectively at temperatures below about 150°-200° K. Cooling the silicon amplifier circuit to the same temperature as the detector causes "freeze-out" of the dopants in the silicon, thus reducing transistor gain levels. Such "freeze-out" causes the transistors to become practically inoperative for electrically coupling the detector to the multiplexer circuit.

In recent years, focal plane platforms have been fabricated from various materials. Titanium, tungsten, copper, KOVAR and beryllium have been used, but unfortunately the platforms have not been designed to thermally isolate the readout circuit from the detector under thermal cycling conditions. While such materials provide an adequate thermal heat sink for the detector, none provide the thermal isolation necessary to eliminate the freeze-out problem which can render conventional silicon readout circuits insensitive and/or inoperative.

SUMMARY OF THE INVENTION

An improved focal plane platform for use in an electromagnetic detector assembly is disclosed. The focal plane platform comprises a mounting platform fabricated from a relatively high thermally conductive material, or composite of materials. The mounting platform supports a detector and associated integrated amplification circuitry within the detector assembly. A second material having relatively low thermal conductance is disposed within one or more recesses provided in the mounting platform. The recesses are axially aligned directly under each integrated readout circuit. The second material is provided to thermally isolate the integrated amplifier "readout" circuits during cryogenic cooling of the detector.

BRIEF DESCRIPTION OF THE DRAWINGS

Various advantages of the present invention will become apparent to one skilled in the art upon reading the following specification and references to the drawings in which.

DETAILED DESCRIPTION OF THE PREFERRED EMBODIMENTS

Typically, focal plane platforms are fabricated from one or more materials which provide a thermal coefficient of expansion that closely parallels that of conventional infrared detector arrays at cryogenic temperatures. Such materials are selected to provide a relatively distortion-free platform. Resistance to thermal distortion is critical in systems using "hybridized" detectors to inhibit premature failure of the direct electrical connections between the detector array and the integrated readout chip. While distortion resistance is less critical in "non-hybridized" detectors (the detector array and integrated readout chip are indirectly electrically interconnected) thermal fatigue failure of electrical connections is still a major concern.

The present invention provides an improved focal plane platform used for supporting "non-hybridized" detectors in an infrared detector assembly. The focal plane platform permits the detector array and the integrated readout chip to operate at separate and optimum temperatures. In short, the detector array is in direct thermal communication with a cryogenic cooling system while the integrated readout chips are thermally isolated therefrom. As will be hereinafter detailed, the detector array can be cooled to its optimum operating temperature (about 80° K.) while the dissipative electrical biasing power generated by the integrated readout chips heat the readout chips to their optimum operating temperature (about 150°–200° K). In this manner, freeze-out problems are substantially reduced or eliminated.

Figure 1:
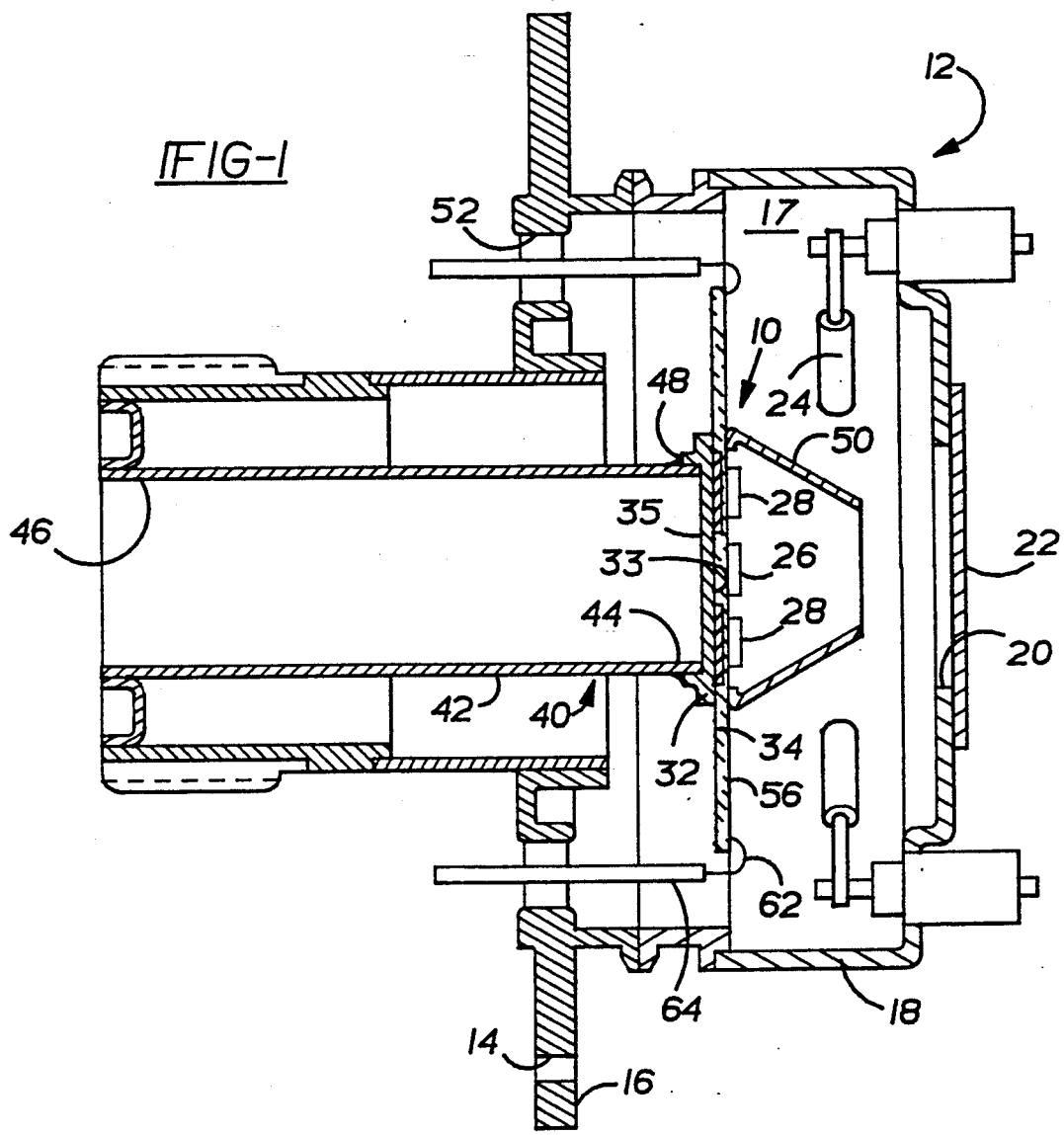
FIG. 1 is a cross-sectional view of an infrared detector/dewar seeker assembly equipped with an improved focal plane platform illustrating the operational association of the components.

With reference to the drawings, improved focal plane platforms according to the preferred embodiments of the present invention are shown. FIG. 1 illustrates a detector assembly 12, such as an infrared detector/dewar seeker, having focal plane platform 10 assembled therein. Detector assembly 12 is secured to a mounting structure by a plurality of fasteners (not shown) which extend through bore 14 on mounting flange 16. Dewar housing 18 encloses the forward end of detector assembly 12 and has a central aperture 20 covered by infrared window 22. Window 22 is fabricated from germanium or zinc senenide to produce the desired transmission band, and is used to transmit incoming infrared radiation to the detector. Getters 24 are provided to absorb any outgassing which escapes into the interior cavity 17 of housing 18. Detector assembly 12 includes a photoconductive or photovoltaic detector array 26 for receiving infrared radiation and generating responsive electrical signals. Detector array 26 is preferably a mercury-cadmium-telluride photoconductive array. However, any detector array adaptable to receive infrared radiation can be used. Photodetector array 26 is electrically interfaced with an integrated readout circuit 28. Preferably, the readout circuit 28 is a silicon bipolar amplifier chip. The preferred embodiments include two such readout chips 28 provided on opposite lateral sides of detector array 26. Detector array 26 and readout chips 28 are electrically interconnected, and secured to, focal plane platform 10 by electrically conductive metallic contact bumps 30, preferably fabricated from indium. Indium contact bumps 30 are used since indium is known for its ability to form stable cold-welds with itself as well as for its electrical conductivity.

Figure 2:
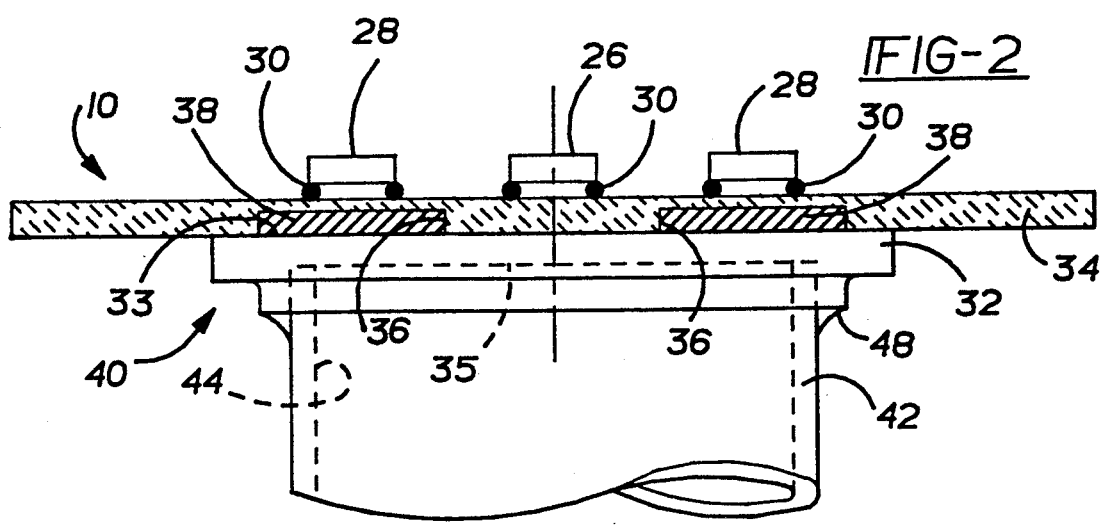
FIG. 2 is a side-view of an improved focal plane platform in accordance with a first preferred embodiment of the present invention.
Figure 3:
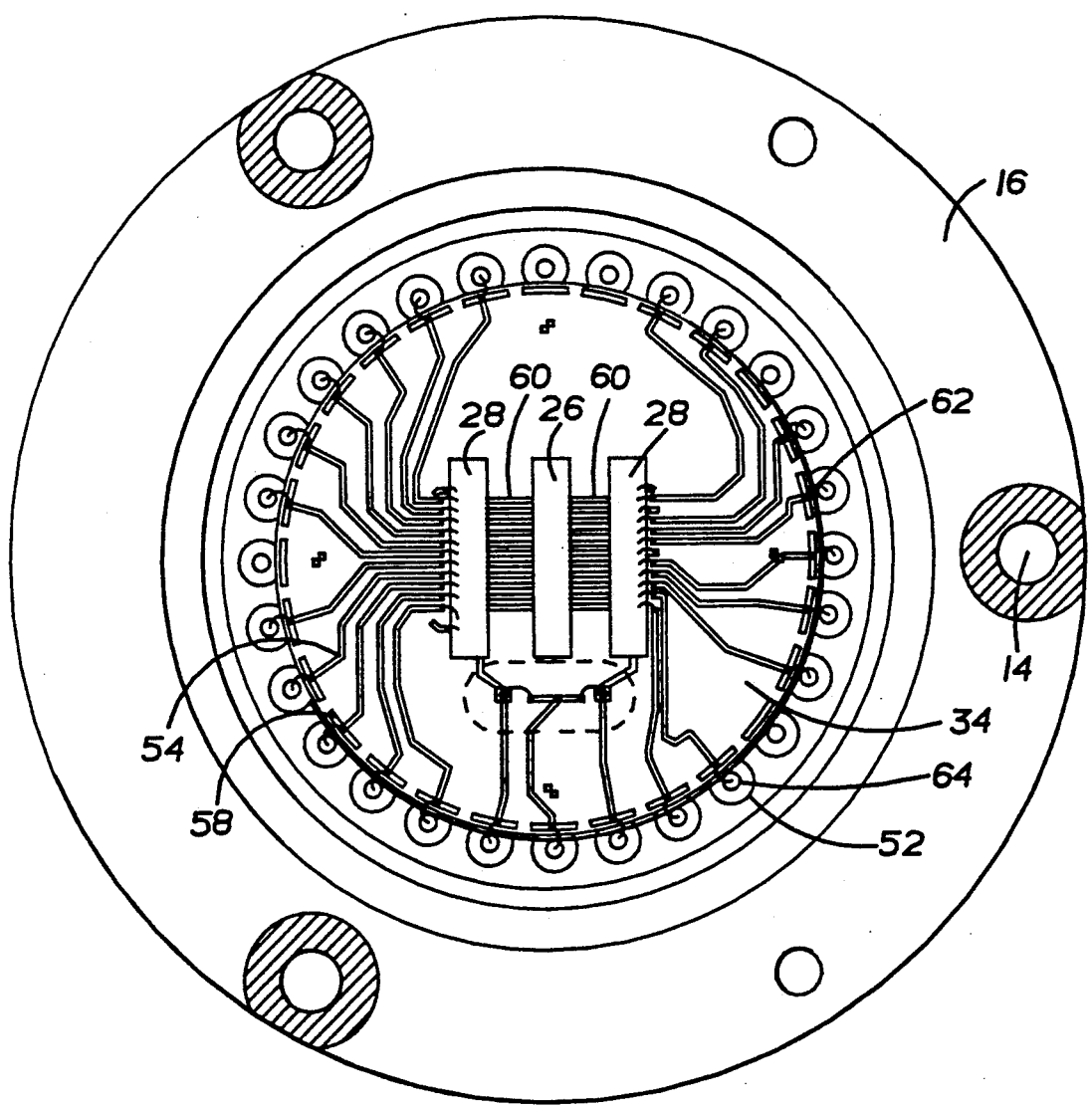
FIG. 3 is a top view of FIG. 1 with the dewar housing removed illustrating the electrical interconnection of the components.

According to a first preferred embodiment, as illustrated in FIGS. 1, 2 and 3, focal plane platform 10 comprises an end-cap 32 and a mounting board 34. End-cap 32 is preferably fabricated from tungsten in a disc-shaped configuration so as to have a relatively low thermal mass and relatively high thermal conductivity. However, any suitable material or composite of materials which provide the requisite thermal conductivity characteristics could be utilized.

End-cap 32 has first and second surfaces 33 and 35, respectively. Surface 33 is substantially planar. In accordance with the embodiment shown in FIGS. 1 and 2, surface 35 is configured to enclose and hermetically seal a coldfinger tube described below. Mounting board 34 has a disc-shaped configuration having a larger cross-section than end-cap 32. Mounting board 34 provides a relatively stress-free platform upon which detector array 26 and readout chip 28 are mounted. Preferably, mounting board 34 is fabricated from a polycrystalline sapphire ceramic structure known as alumina which is at least about 97% pure. However, any suitable material having the requisite high thermal conductivity for permitting thermal communication between the detector array 26 and the end-cap 32 is readily adaptable.

Mounting board 34 is secured to first surface 33 of end-cap 32 by means of a thermally conductive adhesive, such as alumina filled epoxy, so as to define focal plane platform 10. Mounting board 34 is provided with recessed cavities 36 on each side of detector array 26 which are generally aligned below each of the silicon readout chips 28. In this manner, a relatively large cross-section of the thermally conductive mounting board 34 is in thermal communication with detector array 26 and end-cap 32. This permits efficient transfer of thermal energy from the detector array 26 during cylical cooling. Within the recessed cavities 36 are disposed inserts 38 fabricated from a material having a relatively low thermal conductance. The inserts 38, preferably fabricated from stainless steel, act to thermally insulate the readout chips 28 from the end-cap 32 and the cryogenic cooling system (not shown). Therefor, detector array 26 is in direct thermal communication with the end-cap 32 and the cryogenic cooling system while readout chips 28 are thermally insulated therefrom. Given this configuration, the detector array 26 can be cooled to its optimum sensitivity temperature of about 77° K., while the dissipative power from the readout chips 28 provides sufficient heat to allow the readout chips 28 to perform at their optimal sensitivity temperature range of about 150°–200° K.

To remove thermal energy from detector array 26 so as to permit optimum detector performance, detector assembly 12 further comprises a coldfinger assembly 40. Coldfinger assembly 40 includes a coldfinger tube 42 which is bonded to second surface 35 of end-cap 32 to provide a hermetic seal therebetween. Coldfinger tube 42 houses the refrigeration mechanism for cooling fluid from the cryogenic cooling system (not shown). By expansion of the fluid inside coldfinger tube 42, thermal energy is drawn from focal plane platform 10 thereby cooling detector array 26. Preferably, coldfinger tube 42 is fabricated from a thin-walled right circular titanium alloy tube and which has a cold end 44 and warm end 46 (referring to their temperatures during use). Cold end 44 is enclosed by end-cap 32. A metallurgical bond 48 is provided therebetween to produce a hermetic, thermally stable coldfinger assembly 40. However, it is contemplated that any other suitable material possessing similar thermal characteristics and which can be hermetically joined to focal plane platform 10 may be used.

To minimize the amount of thermal radiation delivered to detector array 26 from sources other than the scene, a coldshield 50 is provided which is centrally located over detector array 26. Coldshield 50 is adhesively secured to mounting board 34 in coaxial relation to detector array 26. Coldshield 50 has an aperture which provides an unobstructed path for infrared radiation from the environment to be received by detector array 26. Coldshield 50 is thin walled and is fabricated from a high conductivity material so as to have a relatively low thermal mass which reduces cool-down time. While coldshield 50 may be fabricated from 6061-T6 aluminum, it is to be understood that other suitable materials may be used.

To permit electrical communication between readout chips 28 and external electronics, wiring associated with detector array 26 and readout chips 28 penetrates mounting flange 16 at feed-through ports 52. Referring now to FIG. 3, means for conducting electrical signals from detector array 26 and readout chips 28 to feed-through ports 52 is illustrated in greater detail. Generally, the surface upon which detector array 26 and readout chips 28 are mounted is "metalized" to provide an electrically conductive communication path. Specifically, a predefined pattern having a plurality of nickel traces 54 is vapor deposited on surface 56 of mounting board 34 prior to the mounting of detector array 26 and readout chips 28. Nickel traces 54 emanate radially from a location relatively near readout chips 28 to a plurality of positions near the peripheral circumference of mounting board 34. More particularly, nickel trace pattern 54 begins at the opposite outermost edges of integrated circuit readout chips 28 and culminates at a plurality of conductive pads 58 located along the outer circumference of mounting board 34. In similar fashion, detector array 26 is electrically interconnected to each of the readout chips 28 via nickel traces 60. The detector array 26 and readout chips 28 are attached to the nickel traces 54 and 60 via "cold-welding" of the metallic (indium) contact bumps thereto to provide a continuous electrical conduction path which is resistant to thermal and mechanical distortion and oscillation. Conductive pads 58 are wire bonded via lead wires 62 to feed-through pins 64 which extend through feed-through ports 52. The means disclosed for electrically conducting signals generated by readout chips 28 in response to detector array 26 to external control electronics (not shown) inhibits premature detector fatigue failure.

Preferably, end-cap 32 has a coefficient of expansion substantially similar to that of detector array 26 thereby permitting effective and efficient transfer of thermal energy from detector array 26 to end-cap 32 without generating excessive thermal distortion. Mounting board 34 provides a neutral surface upon which detector array 26 and readout chips 28 are mounted and which supplements the distortion resistance provided by end-cap 32. The inserts 38 disposed within cavities 36 must have relatively low thermal conductive for isolating readout chips 28 from the cryogenic cooling system. Any material possessing relative low thermal conductance characteristics may be disposed within cavities 36 for thermally isolating the readout chips 28 from the end-cap 32 and the cryogenic cooling system.

Figure 4:
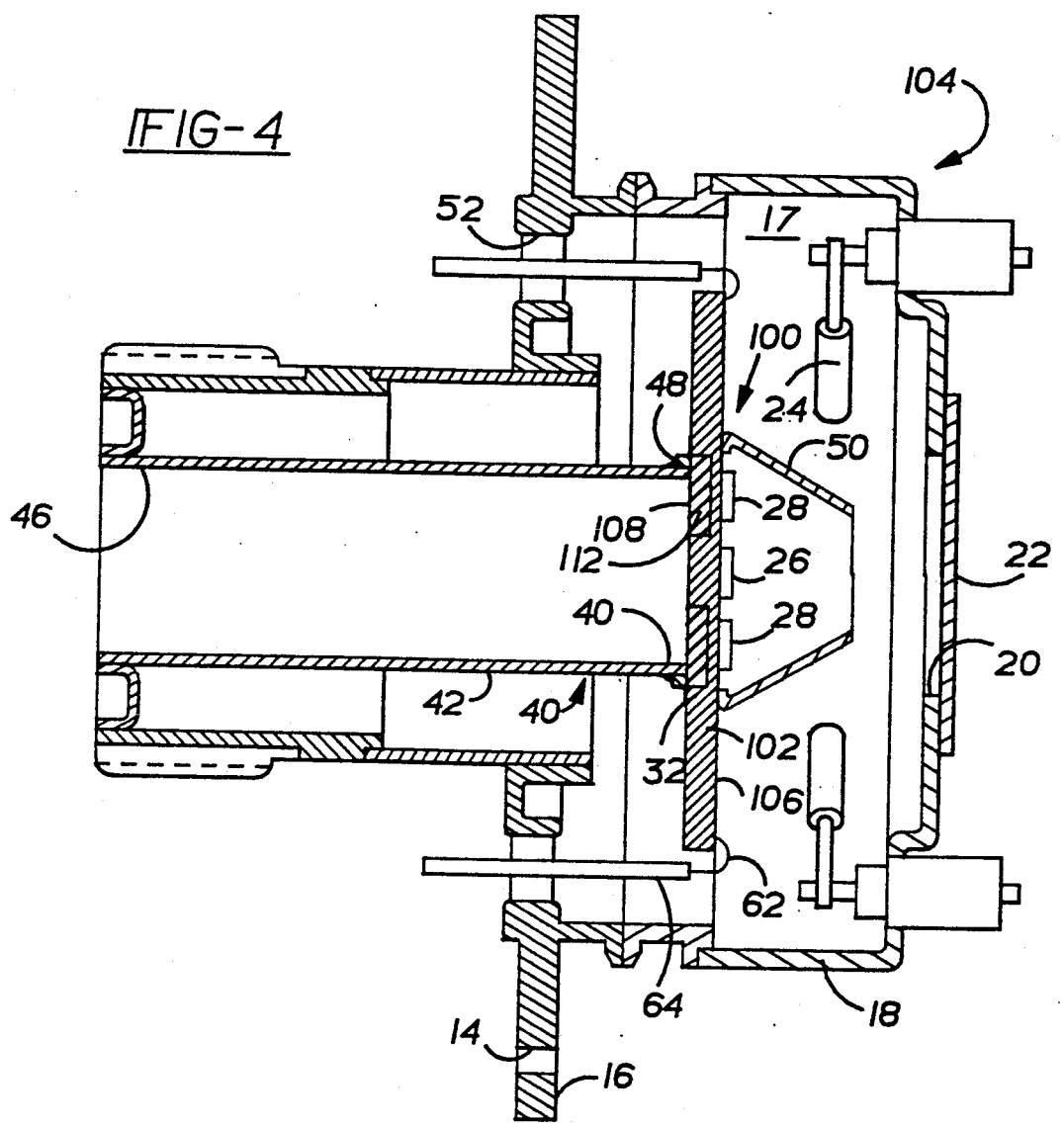
FIG. 4 is a cross-sectional view of an infrared detector/dewar seeker assembly, similar to FIG. 1, illustrating a second embodiment of the present invention.
Figure 5:
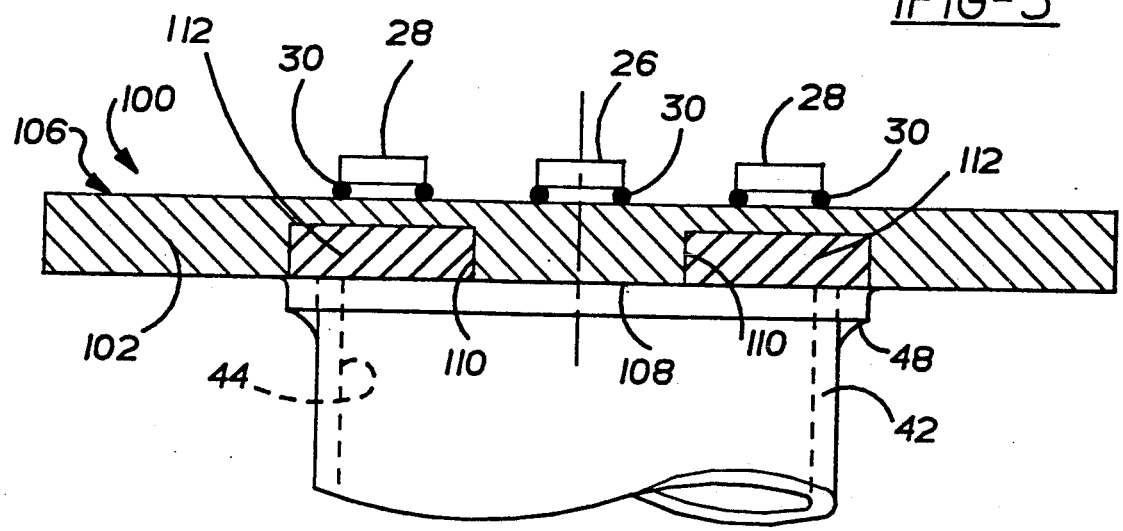
FIG. 5 is a side-view of the improved focal plane platform shown in FIG. 4.

Referring now to FIGS. 4 and 5, a second preferred embodiment is disclosed. Focal plane platform 100 includes an end-cap 102 fabricated from a singular material. The material, as previously detailed, must provide a relatively high thermal conductivity characteristic. Copper is a suitable material for either embodiment disclosed herein. FIG. 4 illustrates a infrared detector/dewar seeker assembly 104, similar to that previously detailed for Figure except for the one-piece end-cap 102.

End-cap 102 has first and second surfaces 106 and 108, respectively. Surface 106 is substantially planar for mounting detector array 26 and readout chips 28 thereon. Surface 108 is configured to enclose and hermetically seal coldfinger tube 42. End-cap 102 is configured to provide one or more recessed cavities 110, extending from surface 108, which are generally axially aligned with each of the silicon readout chips 28. Inserts 112, fabricated from stainless steel or any other material or composite of materials having relatively low thermal conductivity, are disposed within recessed cavities 110. In this manner, a large cross-sectional area of the thermally conductive end-cap 102 is in direct thermal communication with detector array 26 and the cryogenic cooling system. Similarly, a smaller cross-sectional area of the end-cap 102 is thermally communicating with readout chips 28 such that inserts 112 thermally isolate the readout chips 28 from the cryogenic cooling system.

The operation and electrical interconnection of the components illustrated in FIGS. 4 and 5 are identical to that previously disclosed for the first preferred embodiment.

Figure 6:
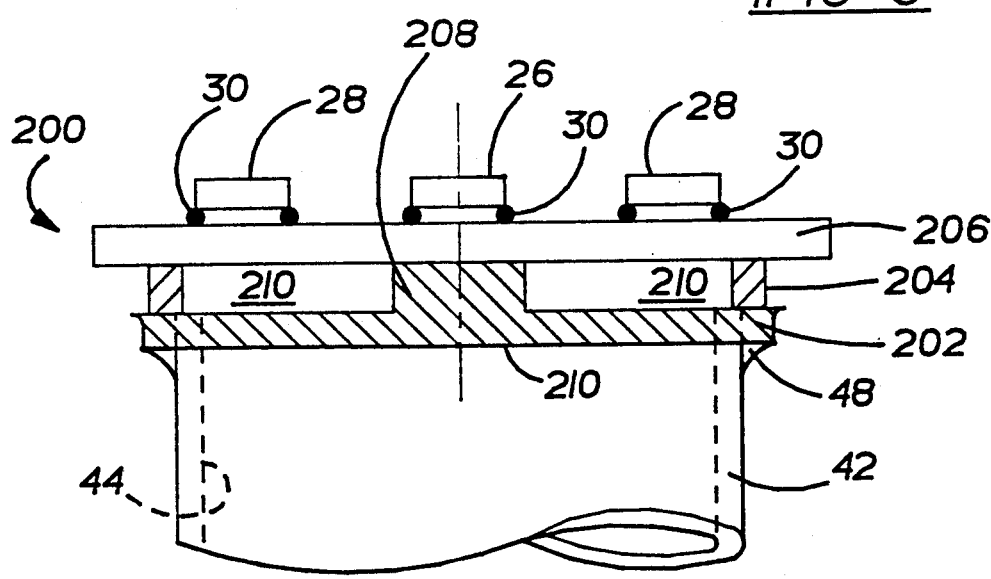
FIG. 6 is a side-view of a third embodiment of the present invention.

According to a third preferred embodiment, as illustrated in FIG. 6, focal plane platform 200 comprises an end-cap 202, a support member 204 and a mounting board 206. End-cap 202 is preferably fabricated in a generally disc-shaped configuration having a centralized, outwardly extending shoulder 208 to provide a relatively low thermal mass and a relatively high thermal conductivity. End-cap 202 is fabricated from a material which provides a relatively high thermal conductivity characteristic so as to act as a cryogenic heat sink. Support member 204 is a ring like component having a height substantially equal to the height of the shoulder 208. Support member 204 is fabricated from a thermally insulative material. Mounting board 206 provides a relatively stress-free platform upon which detector array 26 and readout chips 28 are mounted. Preferably, mounting board 206 is fabricated from glass. However, any suitable material having the requisite thermal conductivity for permitting thermal communication between the detector array and shoulder 208 of end-cap 202 is readily adaptable.

Mounting board 206 is secured to the outer most top surface of shoulder 208 and support member 204 by means of a thermally conductive adhesive, such as alumina filled epoxy. The area between shoulder 208 and support member 204 define cavities 210 on each side of detector array 26 which are generally aligned below each of the silicon readout chips 28. In this manner, a relatively large cross-section of the thermally conductive end-cap 202 is in thermal communication with detector array 26. This permits efficient transfer of the thermal energy from detector array 26 during cyclical cooling. Cavities 210 are evacuated to provide a vacuum environment therein. The vacuum environment provided in cavities 210 act to thermally insulate the readout chips 28 from the end-cap 202 and the cryogenic cooling system (not shown). Therefore, detector array 26 is in direct thermal communication with the end-cap 32 and the cryogenic cooling system while readout chips 28 are thermally insulated therefrom. As previously detailed, the dissipative biasing power from the readout chips 28 provide sufficient heat to allow the readout chips 28 to perform at their optimal sensitivity temperature range of about at least 150°-200° K.

The operation and electrical interfacing of the components illustrated in FIG. 6 are identical to that previously disclosed.

While the preferred embodiments illustrate the utilization of an improved focal plane platform in conjunction with a coldfinger 42, it is contemplated that the present invention is applicable to infrared detector assemblies constructed without a coldfinger tube. As such, the improved focal plane platform, disclosed herein, would supply the requisite mechanical support while providing the highly desirable thermal isolation of the readout chips 28. Further, the advantage of the present invention lies in the thermal isolation of the readout chips 28 to permit operation of the detector array 26 and readout chips 28 at their respective optimum sensitivity temperature ranges.

Those skilled in the art can appreciate that other advantages can be obtained from the use of this invention and that modifications can be made without departing from the true spirit of the invention after studying the specification, drawings and following claims.

We claim:

1. A detector assembly comprising:
   a housing for providing a thermally insulating enclosure;
   a mounting platform within said enclosure, said mounting platform being fabricated from a first material having relatively high thermal conductivity;
   an electromagnetic detector array mounted on said mounting platform for receiving electromagnetic radiation and generating an electrical signal in response thereto;
   at least one integrated readout circuit mounted on said mounting platform and electrically interconnected to said detector array for generating an electrical response to said electrical signal generated by said detector array;
   cooling means for cooling said mounting platform;
   insulating means for thermally insulating said integrated readout circuit from said cooling means; and
   whereby said mounting platform permits thermal communication between said detector array and said cooling means, and said insulating means inhibiting thermal communication between said integrated readout circuit and said cooling means.

2. A detector assembly according to claim 1 wherein said mounting platform further comprises conducting means for electrically interfacing said detector array with said integrated readout circuit, said conducting means electrically conducting said electrical response generated by said integrated readout circuit to an outer peripheral area of said mounting platform.

3. A detector assembly according to claim 2 wherein said conducting means comprises a plurality of electrically conductive nickel traces deposited on said mounting platform.

4. A detector assembly according to claim 1 wherein said mounting platform further includes a cavity below said integrated readout circuit, said cavity being configured for confining said insulating means in close proximity to said integrated readout circuit.

5. A detector assembly according to claim 4 wherein said insulating means comprises a vacuum environment within said cavity, said vacuum environment having relatively low thermal conductivity so as to thermally insulate said integrated readout circuit from said cooling means.

6. A detector assembly according to claim 4 wherein said insulating means comprises an insert disposed within said cavity of said mounting platform, said insert fabricated from a second material having relatively low thermal conductivity.

7. A detector assembly according to claim 6 wherein said cavity is a recessed cavity extending from a surface of said mounting platform opposite that upon which said detector array and said integrated readout circuit are electrically interconnected.

8. A detector assembly according to claim 7 wherein said insert is disposed between said cooling means and said integrated readout circuit.

9. A detector assembly according to claim 6 wherein said mounting platform comprises an end-cap having a first surface upon which said detector array and said integrated readout circuit are electrically interconnected and a second surface configured to hermetically seal said enclosure from said cooling means.

10. A detector assembly according to claim 9 wherein said second surface provides a recessed cavity in axial alignment with said integrated readout circuit, said cavity being configured to accept receipt of said insert therein.

11. A detector assembly according to claim 6 wherein said mounting platform comprises an end-cap secured to a mounting board, said end-cap being configured to hermetically seal said enclosure from said cooling means, said mounting board providing a planar surface for mounting said detector array and said integrated readout circuit.

12. A detector assembly according to claim 11 wherein said insert is disposed between said end-cap and said mounting board.

13. A detector assembly according to claim 6 wherein said integrated readout circuit comprises a silicon bipolar amplifier chip.

14. A detector assembly according to claim 6 wherein said detector array comprises a photoconductive infrared detector array.

15. A detector assembly according to claim 1 wherein said cooling means is a cryogenic cooling system operable to provide a source of thermal energy to cool said detector array to an operating temperature of at least about 77° K.

16. A focal plane platform for supporting a detector array and an integrated readout circuit within a detector assembly, said detector assembly associated with a cryogenic cooling system for cooling said detector array, comprising:
    a mounting platform upon which said detector array and said integrated readout circuit are mounted, at first and second positions thereon, respectively, said mounting platform having relatively high thermal conductivity for providing thermal communication between said detector array and said cooling system; and
    insulating means for thermally insulating said integrated readout circuit from said cooling system.

17. A focal plane platform according to claim 16 wherein said insulating means has low thermal conductivity relative to said mounting platform.

18. A focal plane platform according to claim 17 wherein said insulating means comprises a vacuum environment disposed within a cavity provided in said mounting platform.

19. A focal plane platform according to claim 17 wherein said insulating means comprises an insert disposed within a cavity provided in said mounting platform.

20. A focal plane platform according to claim 19 wherein said cavity is below said second position.

21. A focal plane platform according to claim 16 wherein said mounting platform further comprises conducting means for electrically interconnecting said detector array to said integrated readout circuit, said conducting means electrically conducting electrical signals generated by said detector array and said integrated readout circuit to an outer peripheral area of said mounting platform.

22. A method of thermally insulating an integrated readout circuit during cooling of an electromagnetic detector array, said integrated readout circuit and detector array being supported on a focal plane platform within an evacuated dewar of an electromagnetic detector assembly, said method comprising the steps of:
providing a mounting platform having relatively high thermal conductivity, said detector array and integrated readout circuit being mounted and electrically interconnected on a first surface of said mounting platform;
providing cooling means for thermally cooling said detector array to an operating temperature of at least about 80° K.;
providing insulating means, associated with a second surface of said mounting platform, for thermally insulating said integrated readout circuit from said cooling means; and
whereby said mounting platform permits thermal communication between said detector array and said cooling means, and said insulating means inhibiting thermal communication between said integrated readout circuit and said cooling means to permit said integrated circuit to operate at an optimum temperature range greater than 80° K.

23. A method according to claim 22 wherein said insulating means is a material having low thermal conductance relative to said mounting platform.

* * * * *